(12) United States Patent
Shea et al.

(10) Patent No.: US 7,368,416 B2
(45) Date of Patent: May 6, 2008

(54) METHODS OF REMOVING METAL-CONTAINING MATERIALS

(75) Inventors: Kevin R. Shea, Boise, ID (US); Niraj B. Rana, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/486,525

(22) Filed: Jul. 13, 2006

(65) Prior Publication Data

US 2006/0258165 A1 Nov. 16, 2006

Related U.S. Application Data

(62) Division of application No. 10/841,706, filed on May 6, 2004, now Pat. No. 7,224,682.

(51) Int. Cl.
*H01L 21/461* (2006.01)
(52) U.S. Cl. .................. 510/175; 134/1.3; 438/745
(58) Field of Classification Search .................. None
See application file for complete search history.

(56) References Cited

U.S. PATENT DOCUMENTS

| | | | | |
|---|---|---|---|---|
| 5,364,817 A | * | 11/1994 | Lur et al. | 438/644 |
| 6,090,677 A | * | 7/2000 | Burke et al. | 438/308 |
| 7,211,200 B2 | * | 5/2007 | Chen et al. | 252/79.1 |
| 2005/0090104 A1 | | 4/2005 | Yang et al. | |

* cited by examiner

*Primary Examiner*—Gregory Webb
(74) *Attorney, Agent, or Firm*—Wells St. John P.S.

(57) ABSTRACT

Various methods for selectively etching metal-containing materials (such as, for example, metal nitrides, which can include, for example, titanium nitride) relative to one or more of silicon, silicon dioxide, silicon nitride, and doped silicon oxides in high aspect ratio structures with high etch rates. The etching can utilize hydrogen peroxide in combination with ozone, ammonium hydroxide, tetra-methyl ammonium hydroxide, hydrochloric acid and/or a persulfate. The invention can also utilize ozone in combination with hydrogen peroxide, and/or in combination with one or more of ammonium hydroxide, tetra-methyl ammonium hydroxide and a persulfate. The invention can also utilize ozone, hydrogen peroxide and HCl, with or without persulfate. The invention can also utilize hydrogen peroxide and a phosphate, either alone, or in combination with a persulfate.

15 Claims, 4 Drawing Sheets

METHODS OF REMOVING METAL-CONTAINING MATERIALS

RELATED PATENT DATA

This patent resulted from a divisional application of U.S. patent application Ser. No. 10/841,706, which was filed May 6, 2004; and which is hereby incorporated by reference.

TECHNICAL FIELD

The invention pertains to methods of removing metal-containing materials, and in particular aspects pertains to methods suitable for incorporation into semiconductor fabrication processes during formation of capacitor constructions.

BACKGROUND OF THE INVENTION

Numerous applications exist in which it is desired to selectively etch metal-containing materials relative to other materials. One such application is fabrication of capacitor structures during semiconductor processing. An exemplary process for forming capacitor structures is described with reference to FIGS. 1-4.

Referring initially to FIG. 1, a semiconductor wafer fragment 10 is illustrated at a preliminary processing stage. Fragment 10 comprises a substrate 12 supporting a pair of conductive nodes 14 and 16.

Substrate 12 can comprise, for example, monocrystalline silicon lightly doped with background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Electrical nodes 14 and 16 can comprise, for example, conductively-doped diffusion regions extending into a monocrystalline silicon substrate. Alternatively, or additionally, the conductive nodes can comprise electrically conductive pedestals extending upwardly from conductively-doped source/drain regions, and surrounded by electrically insulative material. Substrate 12 and nodes 14 and 16 are shown diagrammatically in FIG. 1, and it is to be understood that the substrate can comprise multiple layers of material, and further that the conductive nodes 14 and 16 can comprise multiple layers of conductive material.

An electrically insulative material 18 is formed over substrate 12. Insulative material 18 can comprise any suitable electrically insulative material, or combination of electrically insulative materials. For instance, material 18 can comprise silicon dioxide, silicon nitride, doped silicon oxide (such as, for example, borophosphosilicate glass (BPSG) or phosphosilicate glass (PSG)), etc.

A pair of openings 20 and 22 extend into insulative material 18. The openings are partially filled with a first conductive material 24 which can comprise, consist essentially of, or consist of a metal nitride, such as, for example, titanium nitride. First conductive material 24 appears to form a pair of sidewall spacers in the shown cross-sectional view. It is to be understood, however, that the openings 20 and 22 would each have a continuous periphery when viewed from above (typically a circular or elliptical periphery) and accordingly the apparent pair of spacers 24 shown within each of the openings in the cross-sectional view of FIG. 1 would actually be a single spacer extending entirely around the periphery of an opening. Material 24 can be formed in the shown configuration by depositing the material within the openings and across an upper surface of substrate 12. The deposited material will extend across bottom surfaces of the openings. The material can then be removed from over the upper surface of material 18 and from over the bottom surface of the openings with an appropriate etch, to leave the material along the sidewalls of the openings as shown.

A second conductive material 26 is formed within the openings 20 and 22 and physically against the first material 24. Second material 26 can comprise, for example, conductively-doped silicon, such as, for example, conductively-doped polycrystalline silicon. If material 26 comprises silicon, it can be undoped at the processing stage of FIG. 1. Accordingly the silicon can be electrically insulative, rather than in the shown electrically conductive form. Thus, material 26 can be a silicon material which is doped at a processing stage subsequent to that of FIG. 1, or it can be a silicon material which is doped prior to the processing stage of FIG. 1.

The wafer fragment 10 is shown divided into a first segment 30 and a second segment 32. The segments 30 and 32 can correspond to, for example, a memory array region and a region peripheral to the memory array region, respectively.

Referring to FIG. 2, first conductive material 24 (FIG. 1) is selectively etched relative to materials 26 and 18, which forms openings 36 between materials 26 and 18. If material 18 comprises silicon dioxide, silicon nitride, and/or doped oxide; material 26 comprises either doped or undoped silicon; and material 24 comprises a metal nitride (such as, for example, titanium nitride), the etching will typically be conducted with one of three etchant solutions. Such etchant solutions are: (1) sulfuric acid ($H_2SO_4$)/hydrogen peroxide ($H_2O_2$); (2) $H_2O_2$/hydrochloric acid (HCl); and (3) $H_2O_2$/ammonium hydroxide ($NH_4OH$). The $H_2SO_4/H_2O_2$ solution will typically comprise a ratio of sulfuric acid (provided as a commercially available solution of sulfuric acid and water) to hydrogen peroxide (provided as commercially available hydrogen peroxide solution that is about 30 weight percent hydrogen peroxide in water) of from about 10:1 to about 2:1.

The $H_2O_2$/HCl solution will typically be formed by mixing about 5 parts water with about 1 part hydrogen peroxide (provided as commercially available hydrogen peroxide solution that is about 30 weight percent hydrogen peroxide in water) and about 1 part hydrochloric acid (provided as commercially available hydrochloric acid, which is about 29 weight percent HCl in water). The final solution will comprise about 92 weight percent water, about 4.3 weight percent hydrogen peroxide, and about 4.1 weight percent hydrochloric acid.

The $H_2O_2/NH_4OH$ solution will typically be formed by mixing about 10 parts water with about 1 part hydrogen peroxide (the 30 weight percent hydrogen peroxide) and about 1 part ammonium-hydroxide(provided as commercially available ammonium hydroxide, which is about 29 weight percent $NH_4OH$ in water). Accordingly, the final solution will typically comprise about 95 weight percent water, about 2.5 weight percent hydrogen peroxide, and about 2.4 weight percent ammonium hydroxide.

The solutions discussed above are typically utilized at a temperature of from about 50° C. to about 75° C.

Although FIG. 2 shows the etch of the metal nitride material (24 of FIG. 1) as being highly selective relative to materials 18 and 26, such is typically not the case. Instead, some of materials 26 and 18 are removed during the etching of material 24. Removal of materials 26 and 18 decreases the height of materials 18 and 26, and can also increase the width at the upper locations of openings 36 relative to the lower locations of openings 36.

The non-selectivity of the etch becomes increasingly problematic as an aspect ratio of openings 36 increases. In modern processing, it can be desired that material 18 have a thickness of 20,000 Å or more, and that openings 36 are formed to have a width of from about 30 Å to about 150 Å. Accordingly, openings 36 are long capillaries. Etching within the capillaries is slower than etching of surfaces external to the capillaries (with the etching frequently being nearly eight-times slower in the capillaries than along surfaces external to the capillaries). Accordingly, unless the etch for the material 24 (FIG. 1) is highly selective, there will be significant loss of materials 18 and 26 during the etch. Such is a problem with conventional etching processes.

The upwardly-open structures defined by material 26 can be storage nodes for capacitor constructions. The two illustrated storage nodes are labeled as 27 and 29, respectively.

Referring to FIG. 3, the material 18 remaining after formation of openings 36 (FIG. 2) is subjected to an isotropic etch to remove the material 18 from between storage nodes 27 and 29. Since the etchant solution can penetrate into openings 36 (FIG. 2) the material 18 between structures 27 and 29 is subjected to etching from all sides during the isotropic etch, whereas the material 18 over region 32 is subjected to etching from the upper surface only. The material 18 over region 32 is thus removed more slowly than the material 18 between structures 27 and 29. Accordingly, some of material 18 remains over region 32 after removal of all of the material from between structures 27 and 29. It is desired to leave material 18 over region 32 after the isotropic etch of material 18, so that the material 18 can protect circuit device structures (not shown) associated with region 32 during subsequent processing.

The structure shown in FIG. 3 is an idealized prior art structure, and a "hoped for" structure during the processing of FIGS. 1-3. The structure can result if openings 36 (FIG. 2) have a low enough aspect ratio, so that the non-selectivity of the prior art etch does not significantly impact the height of material 18 during removal of material 24 (FIG. 1) in formation of openings 36 (FIG. 2). However, if the openings have a high enough aspect ratio, the non-selectivity of the etch will significantly reduce the height of material 18 during formation of openings 36. If the height of material 18 is reduced too much, the desired structure of FIG. 3 will not result. Instead, material 18 will be removed from over both of regions 30 and 32 during the isotropic etch of material 18.

Referring to FIG. 4, a capacitor dielectric material 40 and a second capacitor electrode 42 are formed over capacitor storage nodes 27 and 29. Capacitor dielectric material 40 can comprise any suitable material, or combination of materials, including, for example, silicon dioxide, silicon nitride, and various high-K materials. Electrode 42 can be formed of any suitable conductive material, including, for example, conductively-doped silicon, and/or various metals, and/or various metal compounds. If material 26 comprises undoped silicon at the processing stage of FIGS. 1-3, the silicon will typically be conductively-doped prior to formation of dielectric material 40 and electrode 42. Such doping can be accomplished utilizing various suitable methods including, for example, an implant directly into material 26.

Conductive material 42 is spaced from conductive material 26 by dielectric material 40, and accordingly conductive material 42, dielectric material 40 and storage nodes 27 and 29 form a pair of capacitor constructions 44 and 46. The capacitor constructions can be connected with transistor devices (not shown) and utilized as dynamic random access memory (DRAM) cells, as will be understood by persons of ordinary skill in the art. Materials 40 and 42 are not shown extending over peripheral region 32 in the shown aspect of the prior art. However, it is to be understood that the materials 40 and 42 could also be formed over peripheral region 32 in accordance with some prior art methodologies.

A difficulty in conducting the above-described prior art processing occurs during removal of material 24 (FIG. 1), and results from a lack of a suitably selective etch chemistry having a sufficiently high etch rate to perform in high aspect ratio features. It is therefore desired to develop new etch chemistries having higher selectivity for metal-containing materials (such as, for example, metal nitrides) relative to silicon nitride, silicon dioxide and/or doped silicon oxide.

SUMMARY OF THE INVENTION

The invention encompasses numerous chemistries which can be utilized for selectively etching metal-containing materials. In particular aspects, the chemistries can be utilized for selectively etching metal nitride relative to one or more of silicon (such as, for example, either doped or undoped polycrystalline and/or amorphous silicon), silicon dioxide, silicon nitride, and doped silicon oxide.

In one aspect, an exemplary chemistry of the present invention utilizes hydrogen peroxide in combination with ammonium hydroxide or tetra-methyl ammonium hydroxide. The etchant solution can be formed by mixing about 400 parts of 30 weight percent hydrogen peroxide with about 5 parts of 25 weight percent tetra-methyl ammonium hydroxide or 29 weight percent ammonium hydroxide.

In one aspect, an exemplary chemistry utilizes hydrogen peroxide and hydrochloric acid, with such solution being formed by mixing about 30 weight percent hydrogen peroxide with about 35 weight percent hydrochloric acid in a volume ratio of 400:20.

In other exemplary aspects, chemistries of the present invention utilize a persulfate (such as ammonium persulfate) with hydrogen peroxide, ozone with hydrogen peroxide, a persulfate with hydrogen peroxide and ammonium hydroxide, or a persulfate with hydrogen peroxide and tetra-methyl ammonium hydroxide.

In other exemplary aspects, chemistries of the present invention utilize ozone with ammonium hydroxide and/or tetra-methyl ammonium hydroxide, or utilize ozone in combination with hydrogen peroxide and hydrochloric acid.

In other exemplary aspects, chemistries of the present invention utilize hydrogen peroxide with a phosphate (such as, for example, ammonium phosphate dibasic, $(NH_4)_2HPO_4$, either alone, or in combination with a persulfate (such as, for example, ammonium persulfate).

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
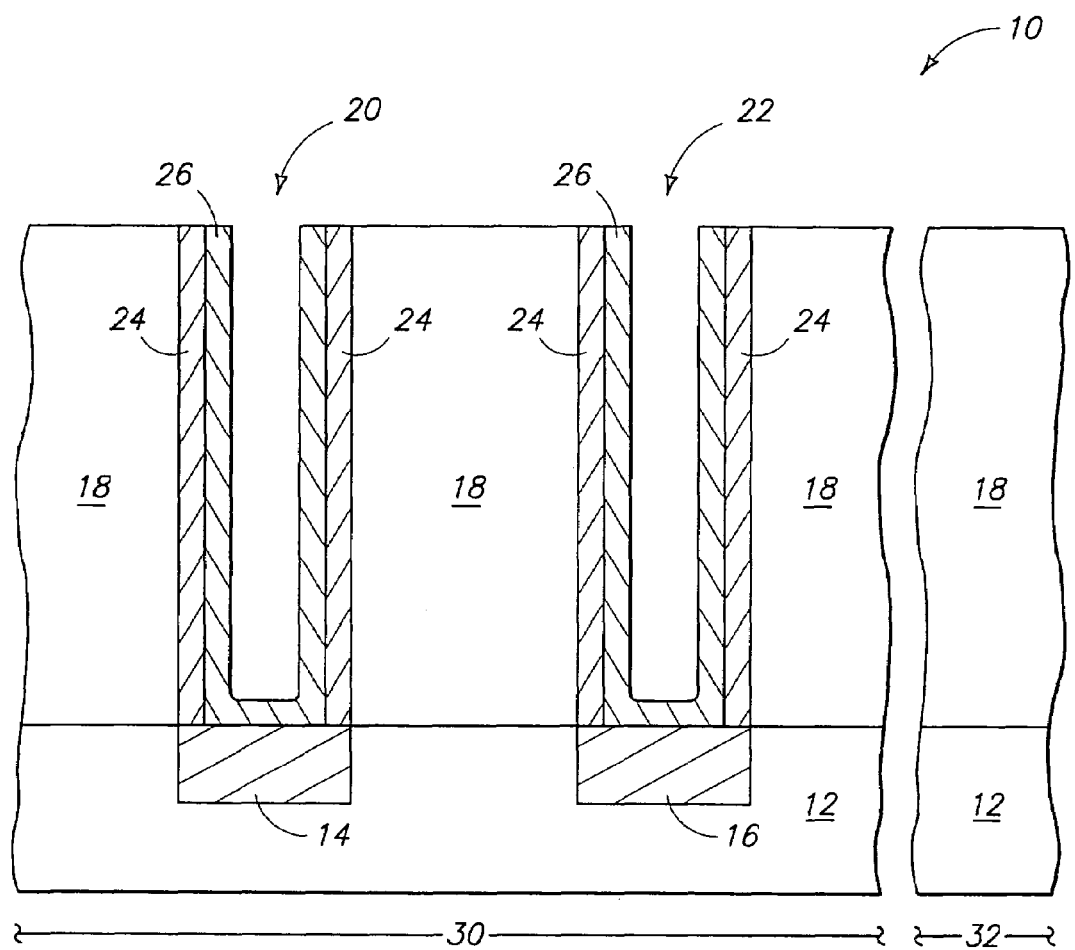
FIG. 1 is a diagrammatic, cross-sectional view of a semiconductor wafer fragment shown at a preliminary processing stage of a prior art method for forming capacitor constructions.

This disclosure of the invention is submitted in furtherance of the constitutional purposes of the U.S. Patent Laws "to promote the progress of science and useful arts" (Article 1, Section 8).

The invention encompasses several new etch chemistries which can be utilized for selectively removing metal-containing materials. The metal-containing materials can, in particular aspects, comprise, consist essentially of, or consist of metal nitrides, such as, for example, titanium nitride. The etching of the present invention can selectively remove the metal-containing materials relative to materials comprising, consisting essentially of, or consisting of silicon (either doped or undoped), doped silicon oxide (such as, for example, BPSG), silicon dioxide, and/or silicon nitride.

In particular aspects, the metal-containing material consists essentially of, or consists of titanium nitride, and such material is selectively removed relative to a material consisting essentially of or consisting of silicon (either doped or undoped, and which can be in the form of, for example, polycrystalline and/or amorphous), and a material consisting essentially of, or consisting of doped silicon oxide (such as BPSG).

The etching solutions of the present invention, when utilized under conditions discussed below, can have a selectivity for the metal nitride relative to the silicon and the doped silicon oxide of at least 600:1 (i.e., can remove the metal nitride at a rate at least 600 times greater than the rate of removal of the other materials), and in particular aspects can have a selectivity of at least 10,000:1, or at least 16,000:1.

Etching solutions of the present invention are preferably utilized at temperatures higher than the conventional temperatures discussed in the "Background" section of this disclosure, and specifically would generally be maintained at temperatures of from about 65° C. to about 95° C. during an etch, and preferably are utilized at temperatures of from about 85° C. to about 95° C., with temperatures of from about 85° C. to about 90° C. being typical.

In some aspects, the invention includes a recognition that there can be advantages to utilizing minimal amounts of acids and bases with the peroxide or other oxidants to accomplish selective removal of metal-containing materials relative to materials consisting essentially, or consisting of silicon (doped or undoped), silicon nitride, silicon dioxide and/or doped silicon oxide. The amount of oxidant in particular etching solutions of the present invention can be increased relative to prior art etching solutions by not adding water to the etching solutions of the present invention. Many of the components utilized in etching solutions of the present invention are generally in the form of aqueous solutions. For instance, hydrogen peroxide is generally available as a solution of about 30% hydrogen peroxide (by weight) in water and HCl is available as a solution of about 35% HCl (by weight) in water. The available solutions of the HCl and hydrogen peroxide can be considered starting components for forming a solution of the present invention. In some aspects, the components of a solution are mixed to form the solution of the present invention without addition of any water beyond that available with the components. Thus, if a solution was formed from the HCl and hydrogen peroxide components discussed above, the solution would not contain water beyond that present with the HCl and hydrogen peroxide in the starting components.

In one aspect of the invention, an etching solution comprises hydrogen peroxide and ozone. Such etching solution can consist essentially of, or consist of hydrogen peroxide, ozone and water, or alternatively can consist essentially of, or consist of hydrogen peroxide, ozone, water and a suitable material (such as HCl) to render the solution acidic, or as yet another alternative can consist essentially of, or consist of ozone, hydrogen peroxide and water and a suitable material (such as TMAH or $NH_4OH$) to render the solution basic.

An exemplary solution comprises, consists essentially of, or consists of hydrogen peroxide, ozone, hydrochloric acid and water. It is to be understood that the solution will typically comprise various ionized forms of the materials contained therein, such as, for example, hydrogen ions (protons) and chlorine ions from hydrochloric acid. Accordingly, a solution referred to herein as consisting of hydrochloric acid, ozone, hydrogen peroxide and water is to be understood to include various ionized forms of the compounds specified as being contained therein. Also, it is to be understood that a solution will consist of particular chemistries described herein when the solution is initially made, and when exposure of the solution to a metal-containing material is initiated. The composition of the solution can then change as the etching of the metal-comprising material is conducted, and specifically as various components of the metal-comprising material are solvated.

In some aspects, the etchant solution can comprise ozone, hydrogen peroxide, and ammonium. The ammonium can be provided in an initial solution with the hydrogen peroxide, and subsequently such initial solution can be mixed with ozone in a suitable spray apparatus. The form of ammonium provided in the initial solution can be, for example, ammonium hydroxide, ammonium persulfate, and/or diammonium phosphate (also called ammonium phosphate dibasic). In similar aspects, the etchant solution can comprise ozone, hydrogen peroxide, and tetra-methyl ammonium hydroxide.

In another aspect of the invention, a metal-containing material, such as, for example, a material comprising, consisting essentially of, or consisting of metal nitride, such as titanium nitride, is removed with a solution comprising hydrogen peroxide and a strong oxidizer, such as, for example, persulfate. The persulfate can be initially provided in the solution as ammonium persulfate, and accordingly the solution can comprise, consist essentially of, or consist of hydrogen peroxide, ammonium persulfate, and water. In further aspects of the invention, a phosphate can be mixed with the solution comprising hydrogen peroxide and persulfate. The phosphate can be, for example, diammonium phosphate. A suitable solution can be formed by mixing hydrogen peroxide, ammonium persulfate, and diammonium phosphate.

The diammonium phosphate can function as a buffering agent. Specifically, a solution of $H_2O_2$ and ammonium persulfate is mildly acidic (pH<5). A basic solution can be preferred in order to reduce particulate contamination. Diammonium phosphate can drive the pH toward neutral and act as buffering agent to maintain the pH in a desired slightly basic range. The inclusion of diammonium phosphate can boost the overall etch rate of the $H_2O_2$ and ammonium persulfate solution. An advantage of utilizing diammonium phosphate relative to other basic agents is that it has less etching of polysilicon (such as material 26 of FIGS. 1-4) than some other basic agents (such as ammonium hydroxide, for example).

In yet other aspects of the invention, a solution can be formed comprising, consisting essentially of, or consisting of hydrogen peroxide and ammonium persulfate, together with one or both of ammonium hydroxide and tetra-methyl ammonium hydroxide. An advantage of tetra-methyl ammonium hydroxide can be better selectivity toward polysilicon than is achieved with other agents (such as ammonium hydroxide).

In another aspect, an etching solution utilized to remove a material comprising, consisting essentially of, or consisting of metal nitride, such as, for example, titanium nitride, comprises hydrogen peroxide and a phosphate. The phosphate can be initially provided in a solution with the hydrogen peroxide as a diammonium phosphate, and accordingly the solution can comprise, consist essentially of, or consist of hydrogen peroxide, ammonium phosphate and water.

In another aspect, a solution utilized for removing a material comprising, consisting essentially of, or consisting of metal nitride (such as, for example, titanium nitride) comprises at least about 10 weight percent hydrogen peroxide and from greater than 0 weight percent to less than 2 weight percent of a nitrogen-containing compound. The nitrogen-containing compound can be, for example, ammonia or ammonium, and in particular aspects can be initially provided in a solution as ammonium hydroxide and/or diammonium phosphate. The nitrogen-containing compound can alternatively be tetra-methyl ammonium, and can be initially provided in a solution as tetra-methyl ammonium hydroxide. In some aspects, the solution can comprise, consist essentially of, or consist of hydrogen peroxide, water and $NH_4OH$, with the $NH_4OH$ being present to a concentration of from about 0.15 weight percent to about 2 weight percent and the hydrogen peroxide being present to a concentration of from about 25 weight percent to about 30 weight percent. In some aspects, the solution can comprise, consist essentially of, or consist of hydrogen peroxide and tetra-methyl ammonium hydroxide, with the tetra-methyl ammonium hydroxide being present to a concentration of from about 0.25 weight percent to about 1 weight percent and the hydrogen peroxide being present to a concentration of from about 25 weight percent to about 30 weight percent.

In another aspect, the invention encompasses a method of removing a material comprising, consisting essentially of, or consisting of metal nitride (such as, for example, titanium nitride) in which the material is exposed to a solution comprising at least 10 weight percent hydrogen peroxide and from greater than 0 weight percent to less than 2 weight percent of a strong acid. The strong acid can be, for example, hydrochloric acid. Accordingly, the solution can consist of hydrogen peroxide, water and hydrochloric acid when the solution is initially made, and when exposing of the metal nitride-containing material to the solution is initiated. In particular aspects, the solution will be formed to comprise, consist essentially of, or consist of hydrogen peroxide, hydrochloric acid and water. The weight percentage of the hydrogen peroxide in the solution can be from about 25 to about 30, and the weight percentage of the hydrochloric acid in the solution can be from about 0.5 to about 2.5, and in some aspects can be from about 1 to about 2.

Various potential roles and effects of particular materials that are present in exemplary etch solutions are as follows. The oxidizing components can etch TiN at a high etch rate; the strong acid (e.g. HCl) can boost an etch rate; the diammonium phosphate can be a buffer and assist in maintaining etch selectivity relative to polysilicon and BPSG); the ammonium hydroxide and TMAH can provide a basic solution which can reduce contamination but which can also reduce selectivity toward polysilicon and can cause pinholes; the EDTA can assist in mass transfer of reaction by-products form capillaries. The roles are provided to assist the reader in understanding aspects of the invention, and are not to be construed as limiting the invention.

Methodologies of the present invention can be utilized for forming capacitor constructions of the type described with reference to FIGS. 1-4. Accordingly, in various methodologies of the present invention, an electrically insulative material (such as the material 18 of FIG. 1) can be formed over a semiconductor substrate (such as substrate 12 of FIG. 1). An opening is formed into the insulative material, such as the opening 20 or 22 of FIG. 1, and such opening has at least one sidewall. A metal-containing material (such as the material 24 of FIG. 1) is formed along the at least one sidewall of the opening. A silicon-containing material (such as the material 26 of FIG. 1) is formed along the metal-containing material. An etch conducted in accordance with the present invention can then be utilized for selectively removing the metal-containing material relative to the insulative material and the silicon-containing material, with such etch having a selectivity for the metal-containing material of at least 600:1, and in some aspects of at least about 1,000:1, of at least about 10,000:1 or even 16,000:1.

As discussed above with reference to FIGS. 1-4, a problem with prior art etch chemistries is that such are not sufficiently selective for metal-containing materials, such as, for example, metal nitrides, like titanium nitride. The prior art etch chemistries do not satisfactorily remove the metal-containing materials from a thin capillary of the type described with reference to FIGS. 1-3 while not removing silicon-containing materials or various insulative materials. Frequently, the etching into the high aspect capillaries of the type described with reference to FIGS. 1-4 will be at least about 8 times slower than normal surface etching. Accordingly, a 5% decrease in the relative etch rate of a metal-containing material to other materials for a high aspect ratio etch of the metal-containing material can equate to a huge increase in the normal surface etching, and accordingly can equate to a significant problem for a process of the type described with reference to FIGS. 1-4.

The metal-containing material 24 described above with reference to FIGS. 1-4 will typically comprise, consist essentially of, or consist of one or more metal nitrides, with a typical metal nitride being titanium nitride. Also, as discussed previously, the silicon-containing material 26 can comprise, consist essentially of, or consist of either doped or undoped silicon material, with typical silicon materials being polycrystalline silicon and/or amorphous silicon. Additionally, as discussed above, insulative material 18 can comprise, consist essentially of, or consist of one or more of silicon nitride, silicon dioxide and doped silicon oxide (such as BPSG and/or PSG). Etching chemistries of the present invention can be selective for metal-containing materials (and specifically for metal nitrides, such as, for example, titanium nitride) relative to at least one of, and typically all of, doped or undoped polycrystalline or amorphous silicon, silicon nitride, silicon dioxide and doped silicon oxide. Accordingly, methodology of the present invention can be particularly useful for application to the capacitor-forming process of FIGS. 1-4.

As discussed above with reference to FIGS. 1-4, it can be desired that the openings formed by removal of the metal-containing material (the openings 36 in FIG. 2) have a very high aspect ratio, with preferred openings having a depth of at least about 20,000 Å, and a width (the gap between insulative material 18 and silicon-containing material 26) of from about 75 Å to about 150 Å. Preferably, such width will be maintained along the entire depth of the opening. Accordingly, it is preferable that an etch of the present invention remove substantially all, or preferably entirely all, of the metal-containing material (24 of FIG. 1) in forming the openings (36 of FIG. 2).

Figure 2:
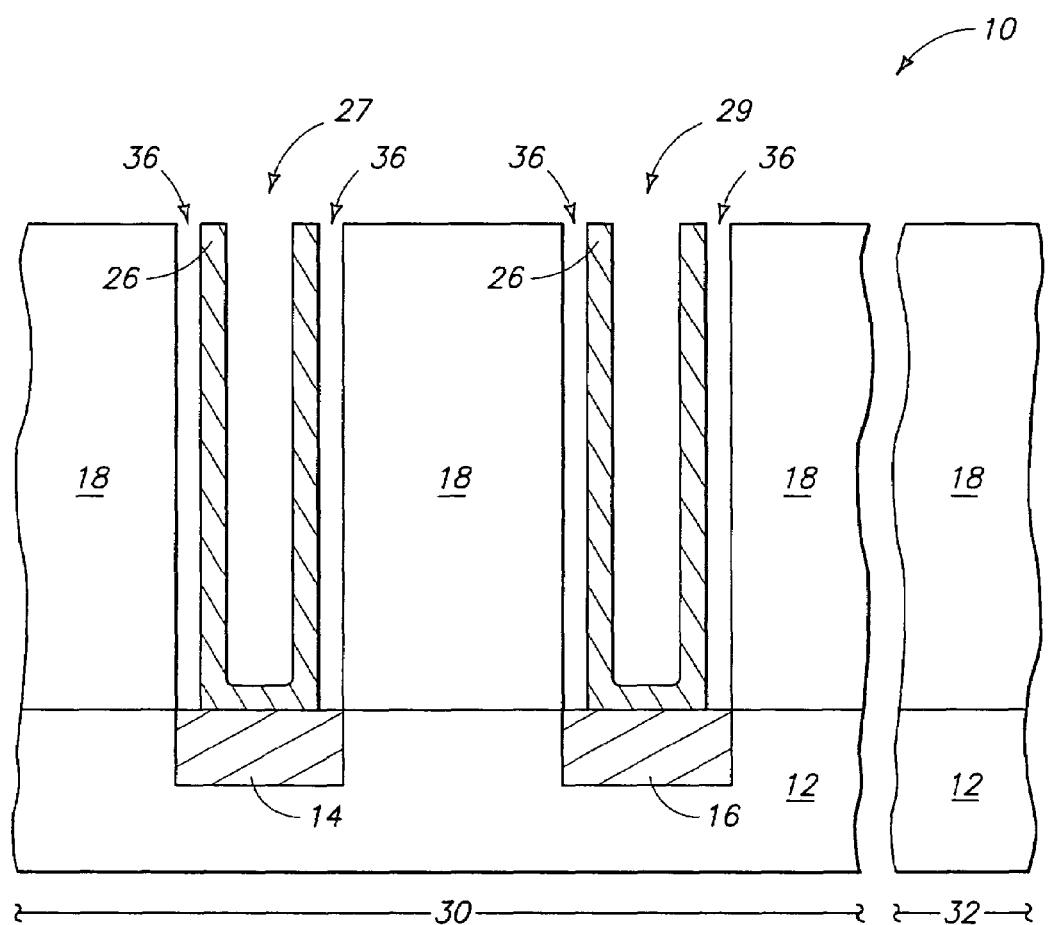
FIG. 2 is a view of the FIG. 1 wafer fragment shown at a prior art processing stage subsequent to that of FIG. 1.
Figure 3:
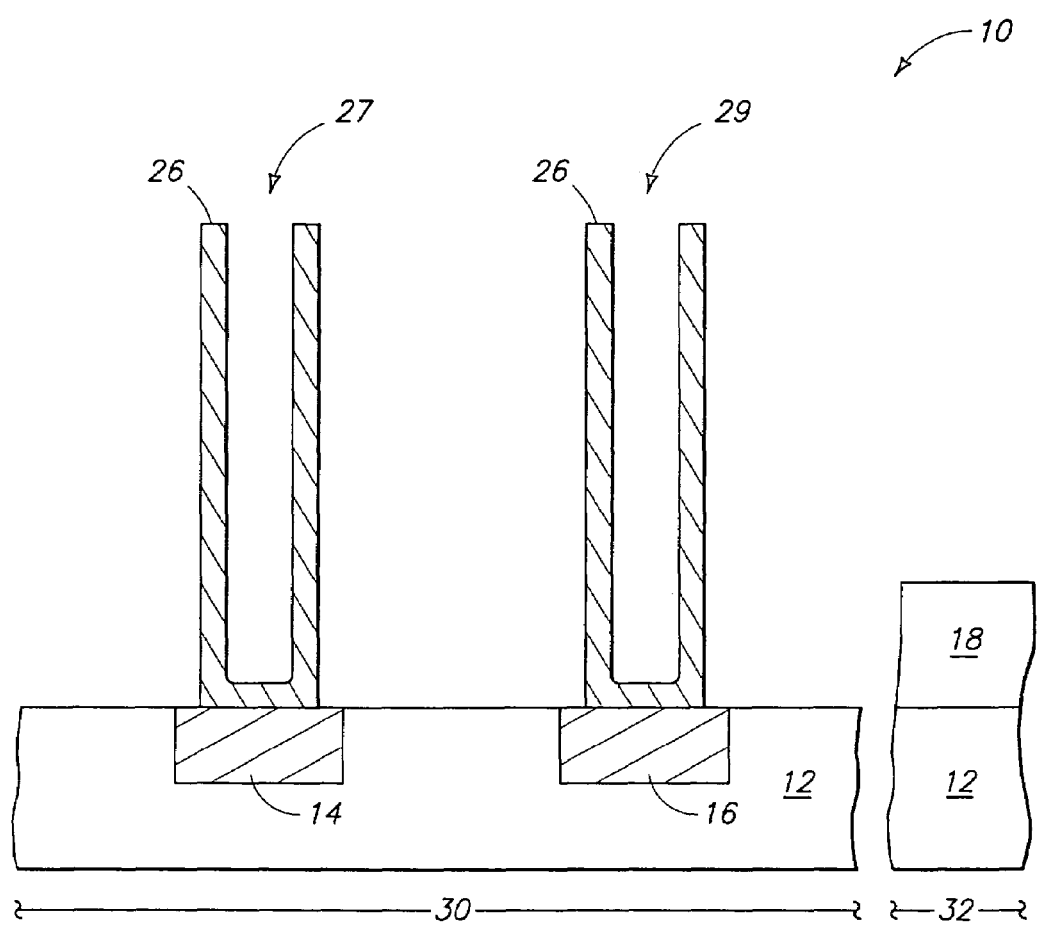
FIG. 3 is a view of the FIG. 1 wafer fragment shown at a prior art processing stage subsequent to that of FIG. 2.
Figure 4:
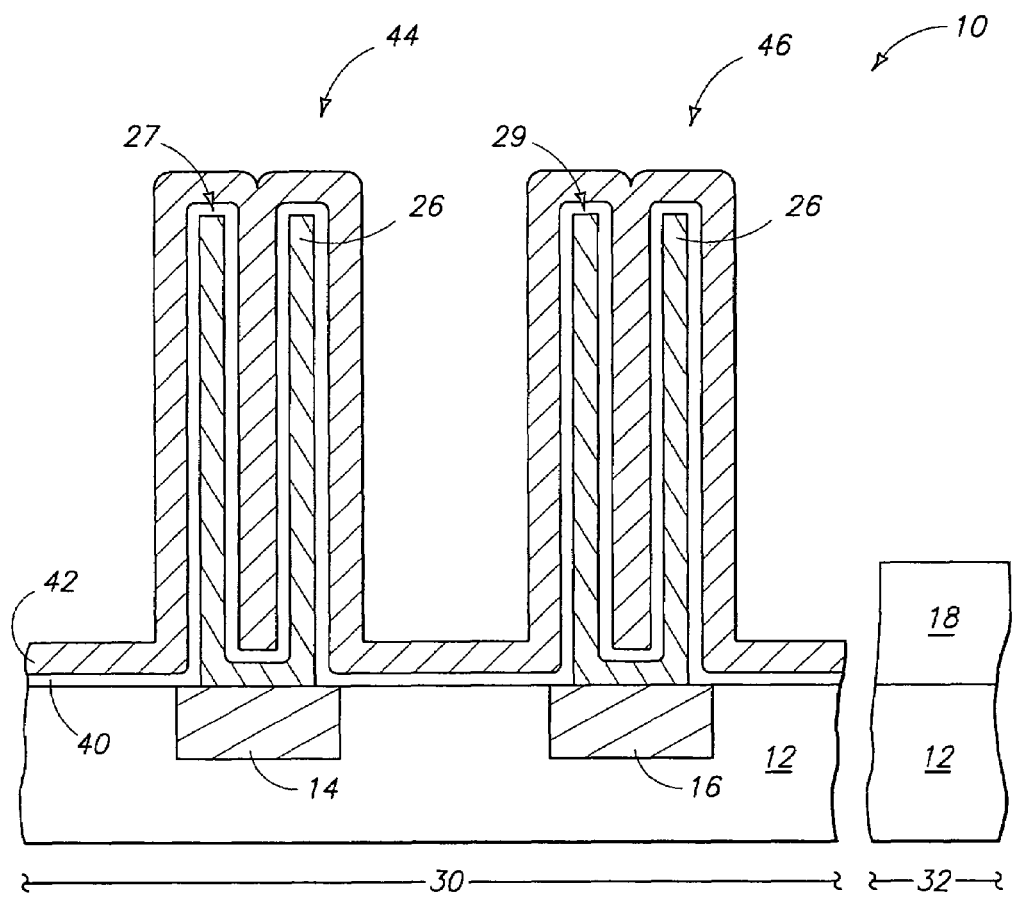
FIG. 4 is a view of the FIG. 1 wafer fragment shown at a prior art processing stage subsequent to that of FIG. 3.

After etching of the present invention has been utilized to form openings analogous to the openings 36 of FIG. 2, the processing described previously with reference to FIGS. 3 and 4 can be conducted to form capacitor constructions. Accordingly, insulative material 18 can be isotropically etched to leave remaining storage node structures of the silicon-containing material (such as the structures 27 and 29 of FIGS. 3 and 4), a capacitor dielectric (such as the material 40 of FIG. 4) can be formed over the remaining structures, and a conductive material (such as the conductive material 42 of FIG. 4) can be formed over the capacitor dielectric material.

Although not mentioned above, it is to be understood that various of the solutions of the invention described above can comprise a metal-scavenging composition (such as a suitable chelator, with an exemplary chelator being ethylenediaminetetraacetic acid (EDTA)) in addition to the other materials discussed. If EDTA is utilized, it can be provided to a concentration of about a few milligrams per liter of solution.

Various examples are described below to assist the reader in understanding the invention. It is to be understood that the invention is not limited to such examples, except to the extent, if any, that one or more of the examples are specifically recited in the claims that follow.

EXAMPLE 1

An etching solution is formed by mixing 400 parts of hydrogen peroxide with 5 parts of ammonium hydroxide. The hydrogen peroxide is 30 weight percent in water and the ammonium hydroxide is 29 weight percent in water. Accordingly, the final solution comprises approximately 30 weight percent hydrogen peroxide, 0.36 weight percent ammonium hydroxide, and 70 weight percent water.

EXAMPLE 2

An etching solution is formed by mixing 400 parts of hydrogen peroxide with 5 parts of tetra-methyl ammonium hydroxide. The hydrogen peroxide is 30 weight percent in water and the tetra-methyl ammonium hydroxide is 25 weight percent in water. Accordingly, the etching solution comprises 30 weight percent hydrogen peroxide, 0.31 weight percent tetra-methyl ammonium hydroxide, and 70 weight percent water.

EXAMPLE 3

An etching solution is formed by mixing 400 parts of hydrogen peroxide with 20 parts of hydrochloric acid. The hydrogen peroxide is 30 weight percent in water and the hydrochloric acid is 35 weight percent in water. Accordingly, the etching solution comprises about 29% hydrogen peroxide, 1.7% hydrochloric acid, and 69% water.

EXAMPLE 4

An etching solution is formed by providing greater than 0% ammonium persulfate (as measured in grams of ammonium persulfate per milliliter of solution) in hydrogen peroxide (with the hydrogen peroxide being 30 weight percent in water). The ammonium persulfate is typically provided to a concentration of less than 40% (as measured in grams of ammonium persulfate per milliliter of solution), with about 21% ammonium persulfate being an exemplary concentration.

EXAMPLE 5

An etching solution is formed by mixing ozone with hydrogen peroxide. The hydrogen peroxide is 30 weight percent in water. The mixing is conducted in a spray apparatus (such as for example, an apparatus distributed as SCEPTER™ by Semitool™) by flowing the ozone at a rate of from about 180 milligrams per liter (mg/L) to about 270 mg/L mixed with 3 L to 8 L of deionized water, and by flowing the hydrogen peroxide at a rate of from about 3 to about 7 liters/minute.

EXAMPLE 6

Ammonium persulfate in the concentration range discussed above with reference to Example 4 is provided in the solution of Example 1.

EXAMPLE 7

Ammonium persulfate in the concentration of Example 4 is provided into the tetra-methyl ammonium hydroxide etching solution of Example 2.

EXAMPLE 8

Ozone is provided with the etching solution of Example 1. The etching solution of Example 1 is flowed into a spray apparatus at a flow rate of from about 3 to about 7 liters/minute, and ozone is flowed into the apparatus at the flow rate of from about 180 milligrams per liter (mg/L) to about 270 mg/L mixed with 3 L to 8 L of deionized water.

EXAMPLE 9

Ozone is mixed with the etching solution of Example 2. The ozone is mixed into the solution utilizing a spray apparatus and a flow rate of the ozone of from about 180 milligrams per liter (mg/L) to about 270 mg/L mixed with 3 L to 8 L of deionized water, and a flow rate of the etch solution of Example 2 of from about 3 to about 7 liters/minute.

EXAMPLE 10

Ozone is mixed with the hydrochloric acid/hydrogen peroxide etching solution of Example 3. The ozone is flowed into a spray apparatus at a flow rate of from about 180 milligrams per liter (mg/L) to about 270 mg/L mixed with 3 L to 8 L of deionized water, and the HCl/$H_2O_2$ solution is flowed into the spray apparatus at a flow rate of from about 3 to about 7 liters/minute.

EXAMPLE 11

An etching solution comprising hydrogen peroxide, ammonium persulfate and ammonium phosphate is formed. The solution can be formed by mixing 400 milliliters of hydrogen peroxide (30 weight percent in water) with about 20 grams of $(NH_4)_2HPO_4$, and with about 60 grams of ammonium persulfate.

EXAMPLE 12

An etching solution comprising ammonium peroxide and ammonium phosphate is formed. Approximately 20 grams of $(NH_4)_2HPO_4$ are provided in about 400 mils of hydrogen peroxide (30 weight percent in water).

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of removing metal-containing material, comprising:
   exposing the metal-containing material to a solution comprising at least about 10 weight percent $H_2O_2$ and from greater than 0 weight percent to less than about 2 weight percent of a nitrogen-containing compound;
   wherein the metal-containing material is received between polycrystalline silicon and borophosphosilicate glass, one side of the metal-containing material being directly against the polycrystalline silicon and an opposing side of the metal-containing material being directly against the borophosphosilicate glass;
   wherein the solution has a selectivity for removing the metal-containing material relative to the polycrystalline silicon and the borophosphosilicate glass of at least 600:1; and
   wherein the exposing of the metal-containing material to the solution removes the metal-containing material from between the polycrystalline silicon and the borophosphosilicate glass to form a space between the polycrystalline silicon and the borophosphosilicate glass.

2. The method of claim 1 wherein the selectivity for removing the metal-containing material relative to the polycrystalline silicon and the borophosphosilicate glass is at least 10,000:1.

3. The method of claim 1 wherein the metal-containing material comprises a metal nitride.

4. The method of claim 1 wherein the metal-containing material consists essentially of a metal nitride.

5. The method of claim 1 wherein the metal-containing material consists of a metal nitride.

6. The method of claim 1 wherein the metal-containing material comprises titanium nitride.

7. The method of claim 1 wherein the metal-containing material consists essentially of titanium nitride.

8. The method of claim 1 wherein the metal-containing material consists of titanium nitride.

9. The method of claim 1 wherein the nitrogen-containing compound is ammonia or ammonium.

10. The method of claim 1 wherein the nitrogen-containing compound is tetra-methyl ammonium hydroxide.

11. The method of claim 1 wherein a temperature of the solution is maintained at from about 65° C. to about 95° C. during the exposing.

12. The method of claim 11 wherein the temperature of the solution is maintained at from about 85° C. to about 95° C. during the exposing.

13. The method of claim 1 wherein the solution consists of water, $H_2O_2$ and ammonium hydroxide when the exposing is initiated.

14. The method of claim 1 wherein the solution consists of water, EDTA, $H_2O_2$ and ammonium hydroxide when the exposing is initiated.

15. The method of claim 1 wherein the solution consists of water, $H_2O_2$ and ammonium phosphate when the exposing is initiated.

* * * * *